(12) United States Patent
Cheng et al.

(10) Patent No.: US 8,617,968 B1
(45) Date of Patent: Dec. 31, 2013

(54) STRAINED SILICON AND STRAINED SILICON GERMANIUM ON INSULATOR METAL OXIDE SEMICONDUCTOR FIELD EFFECT TRANSISTORS (MOSFETS)

(75) Inventors: Kangguo Cheng, Schenectady, NY (US); Bruce B. Doris, Brewster, NY (US); Pouya Hashemi, White Plains, NY (US); Ali Khakifirooz, Mountain View, CA (US)

(73) Assignee: International Business Machines Corporation, Armonk, NY (US)

( * ) Notice: Subject to any disclaimer, the term of this patent is extended or adjusted under 35 U.S.C. 154(b) by 5 days.

(21) Appl. No.: 13/525,479

(22) Filed: Jun. 18, 2012

(51) Int. Cl.
  *H01L 21/20* (2006.01)
(52) U.S. Cl.
  USPC .......... 438/478; 438/149; 438/175; 438/199; 438/218; 438/424; 257/18; 257/55; 257/615; 257/622
(58) Field of Classification Search
  None
  See application file for complete search history.

(56) References Cited

U.S. PATENT DOCUMENTS

| | | | |
|---|---|---|---|
| 5,906,951 A | 5/1999 | Chu et al. | |
| 6,310,367 B1 | 10/2001 | Yagishita et al. | |
| 6,603,156 B2 | 8/2003 | Rim | |
| 6,774,015 B1 | 8/2004 | Cohen et al. | |
| 6,911,379 B2 | 6/2005 | Yeo et al. | |
| 7,018,882 B2 | 3/2006 | Tweet et al. | |
| 7,026,249 B2 | 4/2006 | Bedell et al. | |
| 7,029,964 B2 | 4/2006 | Cheng et al. | |
| 7,091,095 B2 | 8/2006 | Chu | |
| 7,138,309 B2 | 11/2006 | Lee et al. | |
| 7,238,989 B2 | 7/2007 | Yeo et al. | |
| 7,273,800 B2 | 9/2007 | Boyd et al. | |
| 7,524,740 B1 * | 4/2009 | Liu et al. | 438/479 |
| 7,544,585 B2 | 6/2009 | Park et al. | |
| 7,619,239 B2 | 11/2009 | Irisawa et al. | |
| 7,960,794 B2 | 6/2011 | Doyle et al. | |
| 8,008,751 B2 | 8/2011 | Irisawa et al. | |
| 2011/0175166 A1 | 7/2011 | Bedell et al. | |

OTHER PUBLICATIONS

Rim, K., et al., "Fabrication and Mobility Characteristics of Ultrathin Strained Si Directly on Insulator (SSDOI) MOSFETs", IEEE, Dec. 2003.
Khakifirooz, A., et al., "Strain engineered extremely thin SOI (ETSOI) for high-performance CMOS", VLSI, Jun. 2012.

* cited by examiner

*Primary Examiner* — Kyoung Lee
(74) *Attorney, Agent, or Firm* — Scully, Scott, Murphy & Presser, P.C.; Louis J. Percello, Esq.

(57) ABSTRACT

A method of forming a semiconductor device that includes providing a first strained layer of a first composition semiconductor material over a dielectric layer. A first portion of the layer of the first composition semiconductor material is etched or implanted to form relaxed islands of the first composition semiconductor material. A second composition semiconductor material is epitaxially formed over the relaxed island of the first composition semiconductor material. The second composition semiconductor material is intermixed with the relaxed islands of the first composition semiconductor material to provide a second strained layer having a different strain than the first strained layer.

20 Claims, 4 Drawing Sheets

STRAINED SILICON AND STRAINED SILICON GERMANIUM ON INSULATOR METAL OXIDE SEMICONDUCTOR FIELD EFFECT TRANSISTORS (MOSFETS)

BACKGROUND

The present disclosure relates to semiconductor fabrication and more particularly to a method of fabricating a strained semiconductor-on-insulator (SSOI) substrate.

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties.

SUMMARY OF THE INVENTION

In one embodiment, a method of forming a semiconductor device is provided that includes providing a first strained layer of a first composition semiconductor material over a dielectric layer. A first portion of the first strained layer of the first composition semiconductor material is etched to form relaxed islands of the first composition semiconductor material. A second portion of the first strained layer of the first composition semiconductor material is not etched and maintains an intrinsic strain. A second composition semiconductor material is epitaxially formed over the relaxed island of the first composition semiconductor material. The second composition semiconductor material is intermixed with the relaxed islands of the first composition semiconductor material to provide a second strained layer having a different strain than the first strained layer.

In another embodiment, a method of forming a semiconductor device is provided that includes providing a first strained layer of a first composition semiconductor material over a dielectric layer. A first portion of the first strained layer of the first composition semiconductor material is implanted with a dopant to form relaxed islands of the first composition semiconductor material that are separated by amorphous implanted regions of the first composition semiconductor material. A second portion of the first strained layer of the first composition semiconductor material is not etched and maintains an intrinsic strain. A second composition semiconductor material is epitaxially formed over the relaxed island of the first composition semiconductor material. Intermixing the second composition semiconductor material with the relaxed islands of the first composition semiconductor material provides a second strained layer having a different strain than the first strained layer.

BRIEF DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE INVENTION

Figure 1:
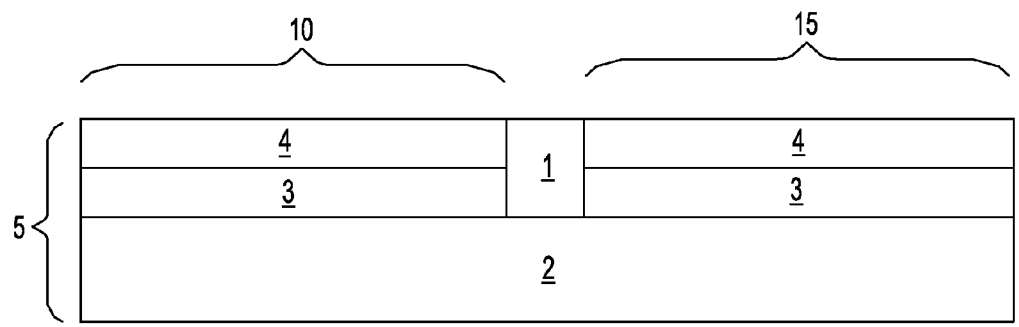
FIG. 1 is a side cross-sectional view depicting one embodiment of a strained semiconductor directly on insulator (SSDOI) substrate, wherein the SSDOI substrate includes a first strained layer of a first composition semiconductor material over a dielectric layer, in accordance with the present disclosure.

Detailed embodiments of the present disclosure are described herein; however, it is to be understood that the disclosed embodiments are merely illustrative of the structures and methods disclosed herein. In addition, each of the examples given in connection with the various embodiments of the disclosure is intended to be illustrative, and not restrictive. Further, the figures are not necessarily to scale, some features may be exaggerated to show details of particular components. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower" "vertical", "horizontal", "top", "bottom", and derivatives thereof shall relate to the structures disclosed herein, as they are oriented in the drawing figures.

Substrate strain engineering is one form of engineering that can increase semiconductor device performance independent of the device pitch. Strained silicon (Si) on insulator having a tensile strain is a semiconductor material that is suitable for providing increased carrier speed, i.e., increased electron carrier speed, for the channel region of n-type semiconductor devices. Strained silicon germanium (SiGe) having a compressive strain is a semiconductor material that is suitable for providing increased carrier speed, i.e., increased hole carrier speed, for the channel region of p-type semiconductor devices. For complementary metal oxide semiconductor (CMOS) device integration, the strained silicon (Si) material having intrinsic tensile strain for n-type semiconductor device optimization, and the strained silicon germanium (SiGe) material having intrinsic compressive strain for p-type semiconductor device optimization should be co-integrated on the same wafer.

In one embodiment, the present disclosure provides a method in which a portion of a strained silicon layer of a strained silicon directly on insulator (SSDOI) substrate is cut into islands to relax the strain, e.g., intrinsic tensile strain, of the strained silicon layer. In some embodiments, the islands of the strained silicon layer may have a length ranging from 100 nm to 200 nm, and the spacing between adjacent islands of the strained silicon layer may have a length ranging from 10 nm to 20 nm. 6 The dimensions for the length of the relaxed islands formed from the strained silicon layer and the spacing between the relaxed islands may vary depending upon the thickness of the strained silicon layer. During formation of the relaxed islands of silicon, the region of the SSDOI substrate that is processed to provide n-type semiconductor devices is protected so that the strained silicon layer that present in that region of the SSDOI is not damaged, i.e., the strain is not relaxed. Silicon germanium (SiGe) may then be epitaxially grown over the relaxed islands of silicon and the spacing between the adjacent relaxed islands of silicon. Because the spacing between the relaxed islands of silicon is small, a continuous silicon germanium (SiGe) layer is formed. Either thermal mixing or condensation can be used to convert the whole relaxed silicon region, i.e., the region of the substrate including the relaxed islands of silicon and the spacing between the adjacent relaxed islands of silicon, into compressively strained silicon germanium (SiGe). P-type semiconductor devices may then be formed on the compressively strained silicon germanium (SiGe). The details of some embodiments of the above described method are now discussed in greater detail with references to FIGS. 1-7B.

FIG. 1 depicts one embodiment of a strained semiconductor directly on insulator (SSDOI) substrate 5. The term "directly on" as used to describe the SSDOI substrate 5 means that a first element, such as a strained semiconductor layer, and a second element, such as a dielectric layer, are connected without any intermediary conducting, insulating or semiconductor layers at the interface of the two elements. In one embodiment, the SSDOI substrate 5 includes a first strained layer 4 of a first composition semiconductor material over a dielectric layer 3. In some embodiments, the dielectric layer 3 separates the overlying first strained layer 4 from an underlying base semiconductor layer 2. The term "strained" as used to describe the first strained layer 4 and the subsequently described second strained layer means that the strained layer 4 has an intrinsic compressive or tensile strain. An "intrinsic strain" as used herein refers to a strain, either compressive or tensile, that is developed within the strained layer, rather than an extrinsic strain that is applied to the layer by an external force.

The first strained layer 4 of the first composition semiconductor material may be a silicon containing layer. In some embodiments, the first composition semiconductor material that provides the first strained layer 4 is silicon (Si). For example, the first strained layer 4 may be composed entirely of silicon (Si), e.g., 100 wt. %. The first strained layer 4 may also be composed substantially entirely of silicon (Si) with incidental impurities. By "substantially entirely" it is meant that the first composition semiconductor material that provides the first strained layer 5 may include up to 5 wt. % of impurities with a remainder of silicon (Si). In one example, the level of impurities that may be present in the first strained layer of the SSDOI substrate 5 at this stage of the present disclosure may be no greater than 3 wt %. Examples of incidental impurities that may be present in the first composition semiconductor material that provides the first strained layer 4 include carbon, hydrogen, fluorine and oxygen and combinations thereof. In another embodiment, the first composition semiconductor material that provides the first strained layer 4 is a silicon-containing material that is greater than 90% silicon. In another embodiment, the first strained layer 4 is a silicon-containing material that is greater than 95% silicon. In yet another embodiment, the first strained layer 4 is comprised of greater than 99% silicon, e.g., 100% silicon. The aforementioned percentages allow for doping with n-type and p-type dopants.

The first strained layer 4 may have a thickness ranging from 1 nm to 100 nm. In some embodiments, the first strained layer 4 may be thinned to a thickness of an extremely thin semiconductor on insulator (ETSOI) layer by planarization, grinding, wet etch, dry etch, oxidation followed by oxide etch, or any combination thereof. One method of thinning the first strained layer 4 is to oxidize the silicon by a thermal dry or wet oxidation process, and then wet etch the oxide layer using a hydrofluoric acid mixture. This process can be repeated to achieve the desired thickness. In one embodiment, the first strained layer 4 has a thickness ranging from 1.0 nm to 10.0 nm. In another embodiment, the first strained layer 4 has a thickness ranging from 1.0 nm to 5.0 nm. In a further embodiment, the first strained layer 4 has a thickness ranging from 3.0 nm to 8.0 nm.

The first strained layer 4 is typically composed of a crystalline material. The term "single crystal crystalline structure" denotes a crystalline solid in which atoms are arranged following specific pattern throughout the entire piece of material. In some embodiments, the single crystal crystalline structure is a crystalline solid, in which the crystal lattice of the entire sample is substantially continuous and substantially unbroken to the edges of the sample. In some embodiments, the single crystal crystalline structure has substantially no grain boundaries. In one example, the first strained layer 4 may be composed of single crystal silicon (Si). In one example, the first strained layer 4 has a (100) crystal orientation. The crystal orientation of the first strained layer 4 may also be (110) and (111).

In some embodiments, the first strained layer 4 is silicon (Si) having an internal tensile stress. For example, in one embodiment, the intrinsic tensile stress in the first strained layer 4 of silicon (Si) may range from 100 MPa to 6 GPa. In another embodiment, the intrinsic tensile stress in the first strained layer 4 of silicon (Si) may range from 200 MPa to 1 GPa.

The dielectric layer 3, separates the first strained layer 4 from the base semiconductor layer 2. The dielectric layer 3 may be an oxide, nitride or oxynitride material. The dielectric layer 3 may also be composed of a high-k dielectric, such as aluminum oxide or hafnium dioxide. In one embodiment, the dielectric layer 3 is an oxide. In one embodiment, the dielectric layer 3 of the SSDOI substrate 5 has a thickness that may range from 10 nm to 500 nm. In another embodiment, the dielectric layer 3 of the SSDOI substrate 5 has a thickness ranging from 50 nm to 100 nm.

The base semiconductor layer 2 may be comprised of a same or a different material as the first strained layer 4. In one embodiment, the base semiconductor layer 2 may comprise at least one of Si, Ge, SiGe, GaAs, InAs, InP, SiCGe, SiC, as well as other III/IV or II/VI compound semiconductors and alloys thereof. In one example, the base semiconductor layer 2 may be amorphous, polycrystalline, or monocrystalline. The base semiconductor layer 2 may have a thickness ranging from 5 nm to 1000 microns.

The SSDOI substrate 5 may be fabricated by providing a "donor" wafer and a "handle" wafer in combination with wafer bonding and smart cut processing. For example, the donor wafer may be formed by epitaxially growing a relaxed silicon germanium (SiGe) layer on a silicon (Si) containing substrate. A silicon (Si) layer may then be grown on the relaxed silicon germanium (SiGe) layer. The silicon (Si) layer that is grown on the relaxed silicon germanium (SiGe) layer will typically be biaxially strained with a tensile strain. A dielectric layer, such as silicon oxide ($SiO_2$), may then grown on the silicon (Si) layer. Forming the dielectric layer on the biaxially strained silicon (Si) layer memorizes the biaxial strain within the silicon (Si) layer to provide an intrinsic tensile strain. The donor wafer may then be implanted with hydrogen and bonded to a handle wafer. Annealing is then performed to bond the wafers and cleave the donor wafer at the location where the peak of the hydrogen implant is located. The silicon germanium (SiGe) layer is then etched away leaving the biaxially strained silicon (Si) layer on the dielectric layer, wherein the dielectric layer is present on top of the handle wafer. In this embodiment, the biaxially strained silicon (Si) layer provides the first strained layer 4 of the SSDOI substrate 5 and the handle wafer provides the base semiconductor layer 2 of the SSDOI substrate 5. The dielectric layer that memorizes the strain in the biaxially strained silicon (Si) layer, provides the dielectric layer 3 that is separating the first strained layer 4 from the base semiconductor layer 2.

Still referring to FIG. 1, an isolation region 1 can be formed into the SSDOI substrate 5. In one embodiment, the isolation region 1 may be a trench isolation region that is formed by lithography and etching to form a trench and deposition to fill the trench with a dielectric, such as silicon oxide ($SiO_2$). A planarization process, such as chemical mechanical polishing, can follow the trench fill step. The positioning of the isolation region 1 can separate a first device region 10 of the SSDOI substrate 5 from a second device region 15 of the SSDOI substrate 5. In some embodiments, in which the tensile strain of the first strained layer 4 is relaxed in the first device region 10 of the SSDOI substrate 5, the first device region 10 provides the site for subsequently formed p-type semiconductor devices, such as p-type field effect transistors (pFETs) or p-type fin field effect transistors (p-type finFETs). In some embodiments, in which the tensile strain of the first strained layer 4 is maintained in the second device region 15 of the SSDOI substrate 5, the second device region 15 provides the site for the subsequently formed n-type field effect transistors (nFETs) or n-type fin field effect transistors (n-type finFETs).

Figure 2:
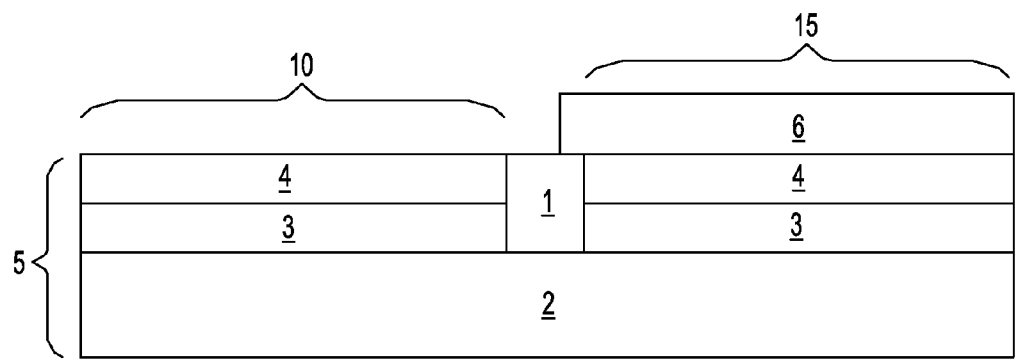
FIG. 2 is a side cross-sectional view depicting one embodiment of forming a block mask on a second device region of the SSDOI substrate that will be processed to provide a second conductivity type semiconductor device, e.g., nFET, while leaving a first device region of the SSDOI substrate exposed, in accordance with the present disclosure.

FIG. 2 depicts one embodiment of forming a block mask 6 on the second device region 15 of the SSDOI substrate 5. In one embodiment, the second device region 15 will be subsequently processed to provide n-type semiconductor devices, such as nFETs or n-type finFETs. Forming the block mask 6 over the SSDOI substrate 5 leaves the first device region 10 of the SSDOI substrate 5 exposed. The block mask 6 may comprise soft and/or hardmask materials and can be formed using deposition, photolithography and etching. In one embodiment, the block mask 6 is composed of a photoresist material. In another embodiment, the block mask 6 is a hardmask composed of a nitride containing material, such as silicon nitride. It is noted that it is not intended that the block mask 6 be limited to only silicon nitride, as the composition of the block mask 6 may include any dielectric material that may be deposited on the SSDOI substrate 5. Other hardmask compositions for the block mask 6 may include silicon oxides, silicon oxynitrides, silicon carbides, silicon carbonitrides, etc. Spin-on dielectrics may also be utilized as a hardmask material including, but not limited to, silsequioxanes, siloxanes, and boron phosphate silicate glass (BPSG). The block mask 6 may also be referred to as a first mask.

Figure 3:
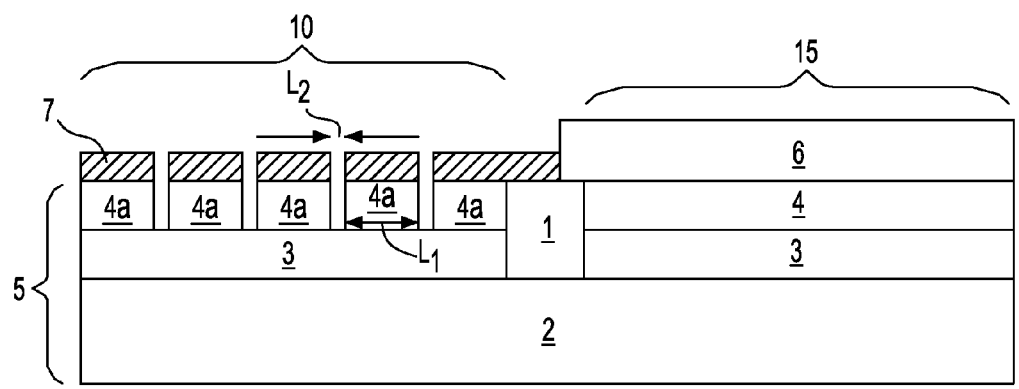
FIG. 3 is a side cross-sectional view depicting forming an etch mask on the first device region of the SSDOI substrate and etching a first portion of the first strained layer of the first composition semiconductor material to form relaxed islands of the first composition semiconductor material, in accordance with one embodiment of the present disclosure.

FIG. 3 depicts one embodiment of forming an etch mask 7 on a first device region 10 of the SSDOI substrate 5 and etching a first portion of the first strained layer of the first composition semiconductor material to form relaxed islands 4a of the first composition semiconductor material. In one embodiment, the etch mask 7 includes openings over regions of the first composition semiconductor material that are present separating the subsequently formed relaxed islands 4a of the first composition semiconductor material. The etch mask 7 may be composed of a photoresist material, which may be formed using deposition, photolithography and development process steps. For example, the photoresist mask that provides the etch mask 7 may be formed by applying a photoresist to the surface to be etched, exposing the photoresist to a pattern of radiation, and then developing the pattern into the photoresist utilizing resist developer. Once the patterning of the photoresist is completed, the sections covered by the photoresist are protected while the exposed regions are removed using a selective etching process that removes the unprotected regions. In another embodiment, the etch mask 7 may be composed of a hardmask material that is similar to the hardmask materials that are described above for the block mask 6. The etch mask 7 may also be referred to as a second mask.

FIG. 3 further depicts one embodiment of applying an etch process that removes the regions of the first composition semiconductor material of the first strained layer that is exposed by the openings in the etch mask 7. Etching the first portion of the first strained layer of the first composition semiconductor material that is present in the first device region 10 of the SSDOI substrate 5 forms the relaxed islands 4a of the first composition semiconductor material, while a second portion of the first strained layer 4 that is present in the second device region 15 of the SSDOI substrate 5 is protected by the block mask 6. The etch process for removing the regions of the first strained layer of the first composition semiconductor material that are present in the first device region 10 to provide the relaxed islands 4a of the first composition semiconductor material may be an etch process that is selective to the block mask 6 and the etch mask 7. As used herein, the term "selective" in reference to a material removal process denotes that the rate of material removal for a first material is greater than the rate of removal for at least another material of the structure to which the material removal process is being applied. In one embodiment, the selectivity may be greater than 10:1. In another embodiment, the selectivity may be greater than 100:1. In one embodiment, the etch process removes the exposed portions of first strained layer that is present in the first device region 10 with an etch chemistry that is selective to the dielectric layer 3 of the SSDOI substrate 5.

In one embodiment, the etch process that removes the portions of the first composition semiconductor material of the first strained layer that are exposed by the openings in the etch mask 7 is an anisotropic etch process. An anisotropic etch process is a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation. The length L1 for each of the relaxed islands 4a of the first composition semiconductor material and the length L2 for the space between the relaxed islands 4a of the first composition semiconductor material are selected to allow for the intrinsic strain within the first strained layer of the first composition semiconductor material to be relaxed. The term "relaxed" as used herein means that the average strain of the etched material perpendicular to the etch direction is less than 20% of the initial intrinsic strain of the material before it was etched. In some embodiments, the stress of the etched material may be less than 10% of the intrinsic strain of the material before it was etched. In one embodiment, the intrinsic tensile strain in the relaxed islands 4a of the first composition semiconductor material is less than 200 MPa for a strained layer 4 that had in intrinsic strain of 1.5 GPa. In one embodiment, the intrinsic tensile strain in the relaxed islands 4a of the first composition semiconductor material ranges from 50 MPa to 150 MPa for an first strained layer 4a that has an intrinsic strain of 1.5 Gpa. In another embodiment, the intrinsic tensile strain in the relaxed islands 4a of the first composition semiconductor material is less than 100 MPa. The portion of the first strained layer 4 of the first composition semiconductor material that is present in the second device region 15 of the SSDOI substrate 5 that is not etched by the etch process that forms the relaxed islands 4a maintains an intrinsic tensile strain. For example, the intrinsic tensile strain of the first strained layer 4 within the second device region 15 may range from 100 MPa to 6 GPa. In another embodiment, the intrinsic tensile stress in the first strained layer 4 within the second device region 15 may range from 200 MPa to 1 GPa.

In one embodiment, the length L1 for each of the relaxed islands 4a of the first composition semiconductor material ranges from 20 nm to 200 nm. In another embodiment, the length L1 for each of the relaxed islands 4a of the first composition semiconductor material ranges from 50 nm to 100 nm. In yet another embodiment, the length L1 for each of the relaxed islands 4a of the first composition semiconductor material ranges from 100 nm to 150 nm. In one embodiment, the length L2 for the space between the adjacent relaxed islands 4a of the first composition semiconductor material may range from 1 nm to 25 nm. In another embodiment, the length L2 for the space between the adjacent relaxed islands 4a of the first composition semiconductor material may range from 5 nm to 20 nm. In yet another embodiment, the length L2 for the space between the adjacent relaxed islands 4a of the first composition semiconductor material may range from 10 nm to 15 nm. The above dimensions for the length L1 of the relaxed islands 4a of the first composition semiconductor material, and the length L2 for the space between the adjacent relaxed islands 4a of the first composition semiconductor material are provided for illustrative purposes only and are not intended to limit the present disclosure. The etch mask 7 is typically removed after the relaxed islands 4a are formed. In one embodiment, the etch mask is removed using selective etching.

Figure 4:
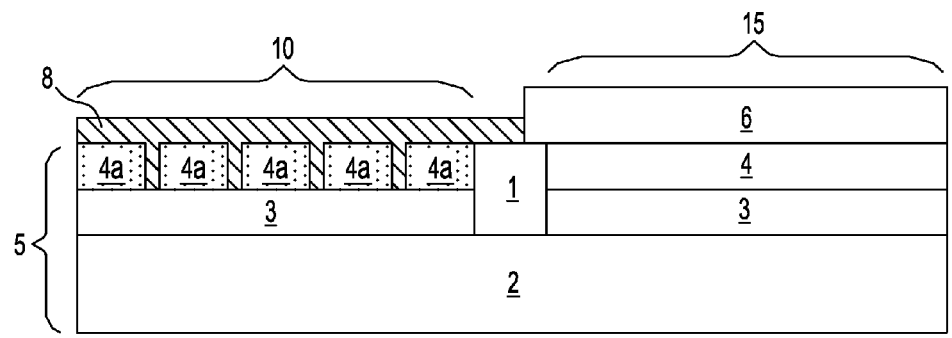
FIG. 4 is a side cross-sectional view depicting one embodiment of forming a second composition semiconductor material over the relaxed islands of the first composition semiconductor material, in accordance with the present disclosure.

FIG. 4 depicts one embodiment of forming a second composition semiconductor material 8 over the relaxed islands 4a of the first composition semiconductor material. The second composition semiconductor material 8 may be selected to convert the relaxed islands 4a of the first composition semiconductor material to a material having an intrinsic compressive strain. The second composition semiconductor material 8 may be selected to have a lattice dimension that is greater than the lattice dimension of the first composition semiconductor material of the relaxed islands 4a. For example, when the relaxed islands 4a of the first composition semiconductor material is composed of silicon (Si), the second composition semiconductor material 8 may be a germanium (Ge) containing material. In some embodiments, the germanium (Ge) content of the second composition semiconductor material 8 may be greater than 20 wt. %. In other embodiments, the second composition semiconductor material 8 may have a germanium (Ge) content that ranges from 20 wt. % to 100 wt. %. In one example, the second composition semiconductor material 8 may be pure germanium (Ge).

In one embodiment, forming the second composition semiconductor material 8 over the relaxed island 4a of the first composition semiconductor material includes epitaxially deposition/epitaxial growth. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation.

A number of different sources may be used for the deposition of epitaxial silicon germanium (SiGe). In some embodiments, the gas source for the deposition of epitaxial SiGe may include a mixture of silicon containing gas sources and germanium containing gas sources. For example, an epitaxial layer of silicon germanium may be deposited from the combination of a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and a germanium gas source that is selected from the group consisting of germane, digermane, halogermane, dichlorogermane, trichlorogermane, tetrachlorogermane and combinations thereof. The germanium content of the epitaxial layer of silicon germanium may range from 5% to 70%, by atomic weight %. In another embodiment, the germanium content of the epitaxial layer of silicon germanium may range from 10% to 40%. The temperature for epitaxial silicon germanium deposition typically ranges from 550° C. to 900° C. Although higher temperature typically results in faster deposition, the faster deposition may result in crystal defects and film cracking.

The second composition semiconductor material 8 may be epitaxially deposited over the relaxed islands 4a of the first composition semiconductor material and the spaces between the relaxed islands 4a of the first composition semiconductor material to provide a deposited layer of the second composition semiconductor material 8 that is continuous. In some embodiments, epitaxial growth of silicon germanium (SiGe) is preferential, wherein the silicon germanium (SiGe) is not formed on dielectrics, such as the block mask 6. In some embodiments, the block mask 6 obstructs the epitaxial deposition of the second composition semiconductor material 8, e.g., silicon germanium (SiGe), on the second device region 15 of the SSDOI substrate 5. In one embodiment, the thickness of the second composition semiconductor material 8 may range from 2 nm to 40 nm, as measured from the upper surface of the relaxed islands 4a of the first composition semiconductor material. In another embodiment, the thickness of the second composition semiconductor material 8 may range from 3 nm to 10 nm.

Figure 5:
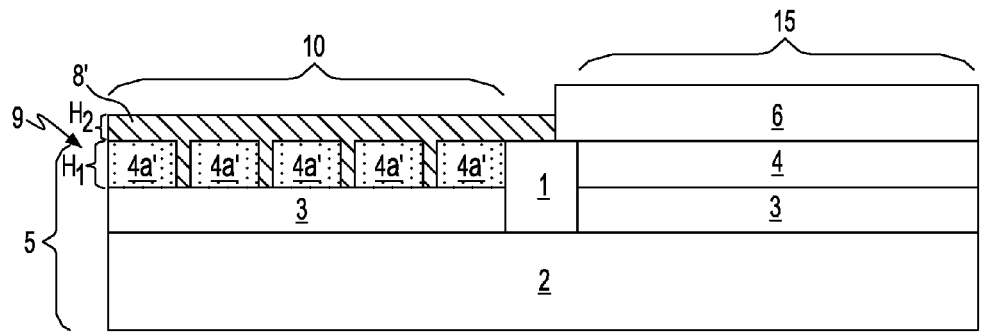
FIG. 5 is a side cross-sectional view depicting one embodiment of intermixing the second composition semiconductor material with the relaxed islands of the first composition semiconductor material to provide a second strained layer of a third composition semiconductor material having a different strain than the first strained layer, in accordance with the present disclosure.

FIG. 5 depicts one embodiment of intermixing the second composition semiconductor material 8' with the relaxed islands 4a' of the first composition semiconductor material to provide a second strained layer 9 of a third composition semiconductor material. In one embodiment, the second strained layer 9 of the third composition has a different strain than the first strained layer 4 of the first composition that is present in the second device region 15. In some embodiments, the intermixing of the second composition semiconductor material 8' with the relaxed islands 4a' of the first composition semiconductor material comprises thermal annealing. In one embodiment, the thermal annealing that intermixes the second composition semiconductor material 8' with the relaxed islands 4a' of the first composition semiconductor comprise an annealing process selected from the group consisting of rapid thermal annealing (RTA), flash lamp annealing, furnace annealing, laser annealing and combinations thereof. In one embodiment, the thermal annealing for intermixing the second composition semiconductor material 8' with the relaxed islands 4a' of the first composition semiconductor material may include a temperature ranging from 800° C. to 1200° C., and a time period ranging from 10 milliseconds to 100 seconds.

In one embodiment, the intermixing of the second composition semiconductor material 8' and the relaxed island 4a of the silicon first composition semiconductor material produces a second strained layer 9 of a third composition semiconductor material of silicon germanium (SiGe) having an intrinsic compressive strain. The lower half H1 of the second strained layer 9 of the third composition semiconductor material may be in direct contact with the upper surface of the dielectric layer 3 in the first device region 10. The lower section H1 of the layer of the third composition semiconductor material of the second strained layer 9 may have a germanium (Ge) content ranging from 10 wt. % to 90 wt %. In another embodiment, the lower section H1 of the layer of the third composition semiconductor material of the second strained layer 9 may have a germanium (Ge) content ranging from 20 wt. % to 40 wt %. The upper section H2 of the layer of the third composition semiconductor material of the second strained layer 9 may have a germanium (Ge) content ranging from 10 wt. % to 90 wt %. In another embodiment, the upper section H2 of the layer of the third composition semiconductor material of the second strained layer 9 may have a germanium (Ge) content ranging from 20 wt. % to 40 wt %.

The thickness of the second strained layer 9 of the third composition semiconductor material of silicon germanium (SiGe) may range from 3 nm to 20 nm. In another embodiment, the thickness of second strained layer 9 of the third composition semiconductor material of silicon germanium (SiGe) may range from 3 nm to 10 nm. In one embodiment, the intrinsic compressive strain that is formed in the second strained layer 9 of the third composition semiconductor material of silicon germanium (SiGe) may range from 300 MPa to 4 GPa. In another embodiment, the intrinsic compressive strain that is formed in the second strained layer 9 of the third composition semiconductor material of silicon germanium (SiGe) may range from 300 MPa to 2 GPa. In one example, the first strained layer 4 that is present in the second device region 15 is tensile strained silicon, and the second strained layer 9 of the third composition semiconductor material that is present in the first device region 10 is compressive strained silicon germanium (SiGe).

Figure 6:
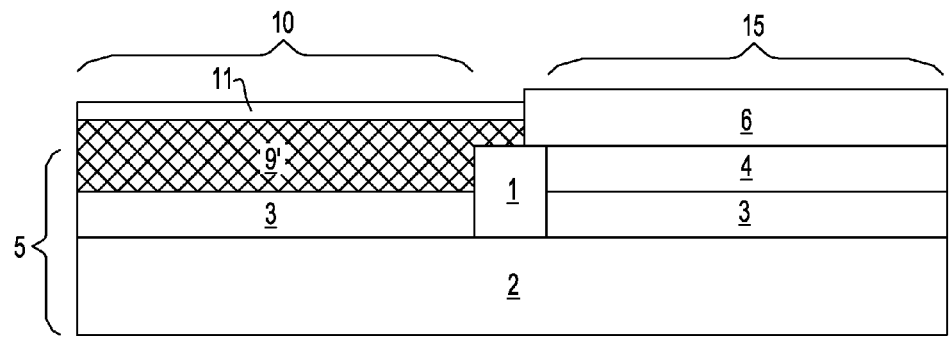
FIG. 6 is a side cross-sectional view depicting oxidizing an upper surface of the second strained layer of the third composition semiconductor material to form an oxide, in accordance with one embodiment of the present disclosure.

FIG. 6 depicts one embodiment of oxidizing an upper surface of the second strained layer 9' of the third composition semiconductor material that is composed of silicon germanium (SiGe) to form an oxide layer 11. Oxidizing the upper surface of the second strained layer 9' may occur during or after the process steps for intermixing the relaxed islands 4a of the first composition semiconductor material and the second composition semiconductor material 8 that are described above with reference to FIG. 5. For example, in one embodiment in which the oxide layer 11 is formed while intermixing the relaxed islands 4a of the first composition semiconductor material and the second composition semiconductor material 8, the thermal processing that causes diffusion of the germanium (Ge) atoms from the second composition semiconductor material 8 of silicon germanium into the relaxed islands 4a of silicon (Si) is performed in an oxygen-containing atmosphere. The application of the oxygen containing atmosphere forms the oxide, e.g., silicon oxide (SiO$_2$), on the upper surface of the second strained layer 9. In another embodiment, the oxide layer 11 is formed by applying a thermal anneal in an oxygen containing atmosphere after the formation of the second strained layer 9 that is depicted in FIG. 5. In each of these cases, silicon (Si) atoms from the silicon germanium (SiGe) layer of the second composition semiconductor material are preferentially oxidized. The oxide layer 11 may be silicon oxide (SiO$_2$), and may have a thickness ranging from 10 nm to 100 nm. In another embodiment, the oxide layer 11 may be silicon oxide (SiO$_2$), and may have a thickness ranging from 20 nm to 50 nm.

In some embodiments, the second strained layer 9' of the third composition semiconductor material may be a germanium (Ge) containing layer that is condensed, i.e., has a higher germanium (Ge) content than the second strained layer 9 that does not include a thermal oxide layer formed thereon. The condensed second strained layer 9' of the third composition semiconductor material (hereafter referred to as condensed second strained layer 9') may be silicon germanium (SiGe) having a germanium (Ge) content ranging from 10 wt. % to 99 wt. %. In another embodiment, the germanium (Ge) content of the condensed second strained layer 9 may range from 20 wt. % to 50 wt. %. Following formation of the condensed second strained layer 9', the oxide layer 11 may be removed using a selective etch process. More specifically, the oxide layer 11 may be removed by an etch chemistry that removes the oxide layer 11 selectively to the condensed second strained layer 9'. The second device region 15 including the first strained layer 4 may be protected by the block mask 15 during the process sequence for forming the condensed second strained layer 9' and removing the oxide layer 11. The process sequence for forming the condensed second strained layer 9' that is depicted in FIG. 6 is optional, and may be omitted.

Figure 7A:
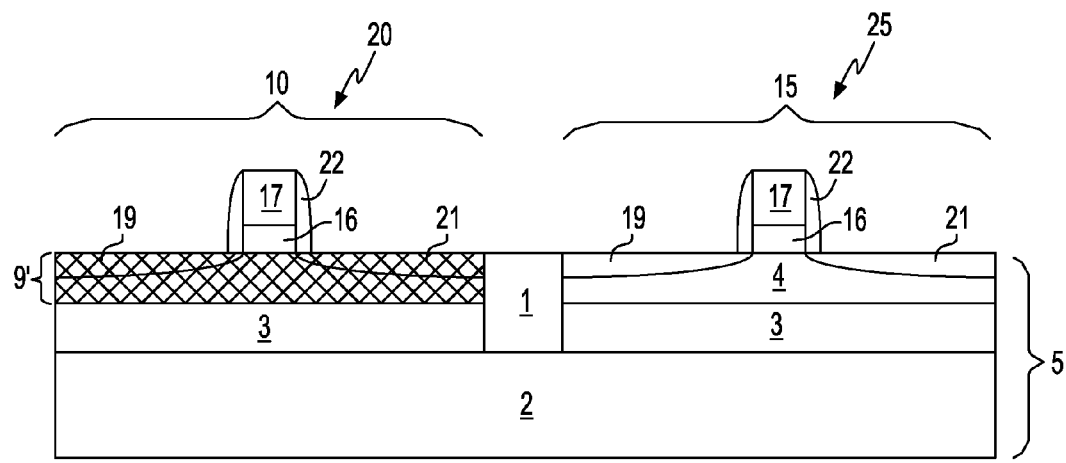
FIG. 7A is a side cross-sectional view depicting forming a n-type planar field effect transistor (nFET) on the first strained layer in the second device region of the SSDOI substrate, and forming a p-type planar field effect transistor (pFET) on the second strained layer in the first device region of the SSDOI substrate, in accordance with one embodiment of the present disclosure.
Figure 7B:
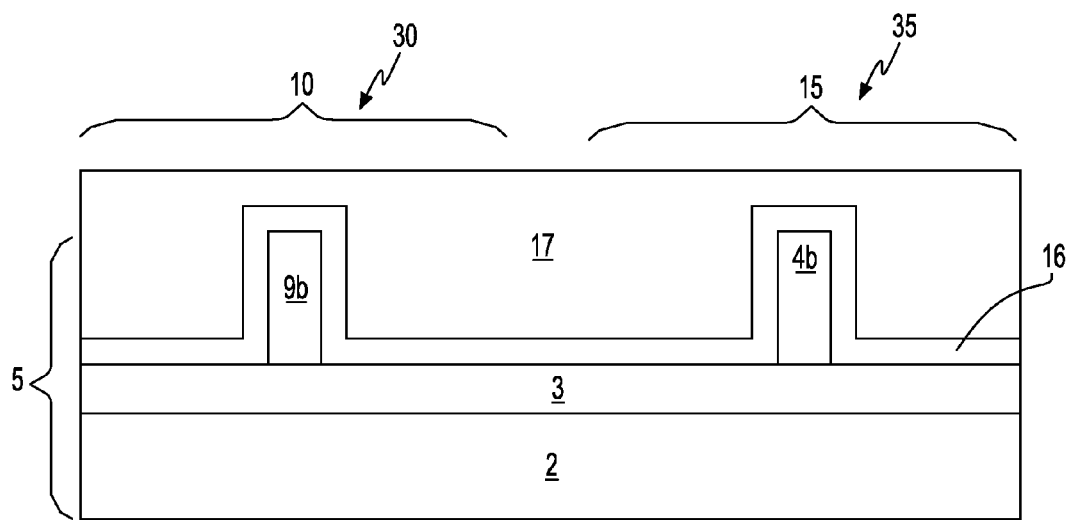
FIG. 7B is a side cross-sectional view depicting forming a n-type fin field effect transistor (n-type finFET) on the first strained layer in the second device region of the SSDOI substrate, and forming a p-type fin field effect transistor (p-type finFET) on the second strained layer in the first device region of the SSDOI substrate, in accordance with one embodiment of the present disclosure.

FIGS. 7A and 7B depict some embodiments of semiconductor devices 20, 25, 30, 35 being formed on the condensed second strained layer 9' and the first strained layer 4 of the SSDOI substrate 5. Before forming the semiconductor devices 20, 25, 30, 35, the block mask 6 may be removed by selective etching. As used herein, a "semiconductor device" is an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. The doping of the source and drain regions of the semiconductor device dictate the conductivity type of the semiconductor device. As used herein, the term "conductivity type" denotes a semiconductor device being p-type or n-type.

In some embodiments, after the oxide layer 11 and the block mask 6 are removed, a first conductivity type semiconductor device 20 may be formed on the upper surface of the condensed second strained layer 9' in the first device region 10 of the SSDOI substrate 5, and a second conductivity type semiconductor device 25 may be formed on the upper surface of the first strained layer 4 in the second device region 15 of the SSDOI substrate 5. In the embodiments, in which the process for forming the condensed second strained layer 9' is omitted, the first conductivity type semiconductor devices 20 may be formed on the second strained layer 9 that is depicted in FIG. 5. The polarity of the semiconductor devices 20, 25, 30, 35, i.e., conductivity type, such as n-type or p-type conductivity, formed on the first strained layer 4 and the second strained layer 9' may be dependent upon whether the first strained layer 4 and the second strained layer 9' is under compressive or tensile intrinsic strain.

Electron carrier mobility in n-type semiconductor device is typically increased when the channel of the n-type semiconductor device is subject to a tensile strain. Therefore, n-type semiconductor devices 25, 35 are formed on the first strained layer 4 when the first strained layer 4 has an intrinsic tensile strain. Hole mobility is typically increased in p-type semiconductor device when the channel of the p-type semiconductor device is subject to a compressive strain. Therefore, p-type conductivity semiconductor devices 20, 30 are formed on the second strained layer 9' when the second strained layer 9' has an intrinsic compressive strain.

Referring to FIGS. 7A and 7B, in one embodiment, the semiconductor devices 20, 25, 30, 35 formed on the first strained layer 4 and the second strained layer 9' are field effect transistors (FETs). A field effect transistor (FET) is a semiconductor device in which output current, i.e., source-drain current, is controlled by the voltage applied to a gate structure. A field effect transistor (FET) has three terminals, i.e., a functional gate structure, a source region and a drain region. The gate structure controls output current, i.e., flow of carriers in the channel, of a semiconducting device, such as a field effect transistor (FET), through electrical or magnetic fields. The channel is the region between the source region and the drain region of a semiconductor device that becomes conductive when the semiconductor device is turned on. A p-type conductivity semiconductor device, such as a pFET, is a semiconductor device in which the source and drain regions of the device are doped with a p-type dopant. An n-type conductivity semiconductor device, such as an nFET, is a semiconductor device in which the source and drain regions of the device are doped with an n-type dopant.

In one embodiment, the field effect transistors (FETs) that are formed on the SSDOI substrate 5 is a planar field effect transistor (FET) 20, 25, as depicted in FIG. 7A, or the field effect transistor (FETs) that are formed on the SSDOI substrate 5 are fin field effect transistor (finFETs) 30, 35. A planar field effect transistor (FET) has a gate structure formed on an upper surface of a semiconductor substrate, in which the channel is present in the semiconductor substrate and has a length that is parallel to the upper surface of the semiconductor substrate. A fin field effect transistor (finFET) is a semiconductor device in which the channel of the semiconductor device is present in a fin structure. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure.

The planar field effect transistor (FET) 20, 25 that are depicted in FIG. 7A may be formed using complementary metal oxide semiconductor (CMOS) processing. One method includes the steps of forming a layered stack comprising a gate dielectric 16 and a gate conductor 17 on each of the first strained layer 4 and the second stained layer 9'. The gate dielectric 16 can be formed by a thermal process, such as oxidation, or by a deposition process, such as chemical vapor deposition (CVD), plasma enhanced CVD, evaporation, atomic layer deposition (ALD) and other like deposition processes. The gate conductor 17 is formed by a deposition process, such as CVD, PECVD, sputtering, plating, evaporation, atomic layer deposition (ALD) and the like. When polySi or SiGe gates are used, the conductive material can be doped in-situ or following deposition by ion implantation. Implantation masks and ion implantations are used to form the FETs of different conductivities. Following the formation of the layered stack, at least the gate conductor 17 (and optionally the gate dielectric) is patterned by lithography and etching. Thereafter, source extension regions 19 and drain extension regions 21 are formed by ion implantation and annealing. Sidewalls spacers 22 are then formed by deposition and etching and thereafter deep source regions (not shown) and deep drain regions (not shown) are formed by ion implantation and annealing.

Referring to FIG. 7A, in one embodiment, n-type planar field effect transistors (nFETs) 25 are formed on the first strained layer 4 when the first strained layer 4 has an intrinsic tensile strain. For example, the first strained layer 4 that provides the channel of the n-type field effect transistors (n-type FETs) may be composed of silicon (Si) having an intrinsic tensile strain. In one embodiment, p-type planar field effect transistors (pFETs) 20 are formed on the second strained layer 9' when the second strained layer 9' has an intrinsic compressive strain. For example, the second strained layer 9' that provides the channel of the p-type planar field effect transistors (p-type FET) may be composed of silicon germanium (SiGe) having an intrinsic compressive strain.

FIG. 7B depicts one embodiment of fin field effect transistors (finFETs) 30, 35 being formed in the first device region 10 and the second device region 15 of the SSDOI substrate 5. Each of the fin field effect transistors (finFETs) 30, 35 may be formed using similar processing as the planar field effect transistors (FETs) 10, 25 that are described above with reference to FIG. 7A. In one embodiment, n-type fin field effect transistors (n-type finFETs) 35 are formed on fin structures formed from the first strained layer 4b when the first strained layer 4b has an intrinsic tensile strain. For example, the first strained layer 4b that provides the fin structure of the n-type fin field effect transistors (n-type finFET) may be composed of silicon (Si) having an intrinsic tensile strain. In one embodiment, p-type fin field effect transistors (p-type finFETs) are formed on fin structures formed from the second strained layer 9b when the second strained layer 9b has an intrinsic compressive strain. For example, the second strained layer 9b that provides the fin structure of the p-type fin field effect transistors (p-type finFET) may be composed of silicon germanium (SiGe) having an intrinsic compressive strain.

Figure 7C:
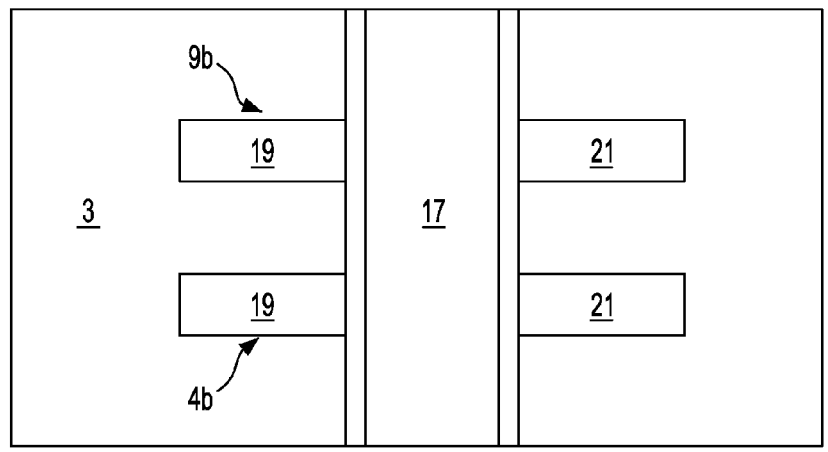
FIG. 7C is a top down view depicting the source and drain regions of the finFETs depicted in FIG. 7B, in accordance with one embodiment of the present disclosure.

Referring to FIG. 7B, one difference between the processing for forming the planar field effect transistors (FETs) and the fin field effect transistors (finFETs) 30, 35 is that the process sequence for forming the fin field effect transistors (finFETs) 30, 35 typically begins with forming a fin structure. The fin structure may be formed from the first strained layer 4b and the second strained layer 9b using photolithography and etch processes. Thereafter, the gate structures including a gate dielectric 16 and a gate conductor 17 are formed on the channel portions of the fin structures, and the source and drain regions (not shown) are formed on opposing sides of the gate structures. FIG. 7C is a top down view depicting one embodiment of the source regions 19 and the drain regions 21 of the finFETs that are depicted in FIG. 7B.

In another embodiment of the present disclosure, portions of a strained silicon layer of a SSDOI substrate that are composed of a first composition semiconductor material, e.g., a silicon layer having an intrinsic tensile strain, are amorphized to relax the intrinsic strain of the first strained layer. In one embodiment, to relax portions of the strained silicon (Si) layer an ion implantation process is conducted to form amorphous implanted regions in the silicon (Si) layer separation relaxed islands of silicon (Si). In some embodiments, the intrinsic strain of the first strain layer is maintained in a second device region of the SSDOI substrate that is protected by a block mask during the ion implantation step the forms the relaxed islands of silicon (Si). A second composition semiconductor material, such as silicon germanium (SiGe) may then be formed on the relaxed islands of silicon (Si). The second composition semiconductor material and the relaxed islands of silicon (Si) may then be intermixed to provide a second strained layer in the first device region of the SSDOI substrate having a different strain than the first strained layer that is present in the second device region of the SSDOI substrate. For example, the second strained layer may be composed of silicon germanium (SiGe) and may have an intrinsic compressive strain, and the first strained layer may be composed of silicon (Si) and may have an intrinsic tensile strain. Further details regarding these embodiments of the present disclosure are now described with reference to FIGS. 1-2, 8-9 and 5-7B.

In some embodiments, the method of forming semiconductor devices including the amorphization implant step to relax intrinsic strain may begin with providing a first strained layer 4 of a first composition semiconductor material over a dielectric layer 3. The first strained layer 4 and the dielectric layer 3 may be elements of a SSDOI substrate 5. The first strained layer 4 has a crystalline crystal structure, such as a single crystal crystalline structure or a polycrystalline crystal structure. Applicants submit that the SSDOI substrate 5 used in the process flow that is described above with reference to FIGS. 1-2 are suitable for this embodiment of the present disclosure. Therefore, the above description of the SSDOI substrate 5, the first stained layer 4 of the first composition semiconductor material and the dielectric layer 3, as well as the other related elements of the SSDOI substrate are suitable for use with the method described with reference to FIGS. 1-2, 8-9 and 5-7B.

Figure 8:
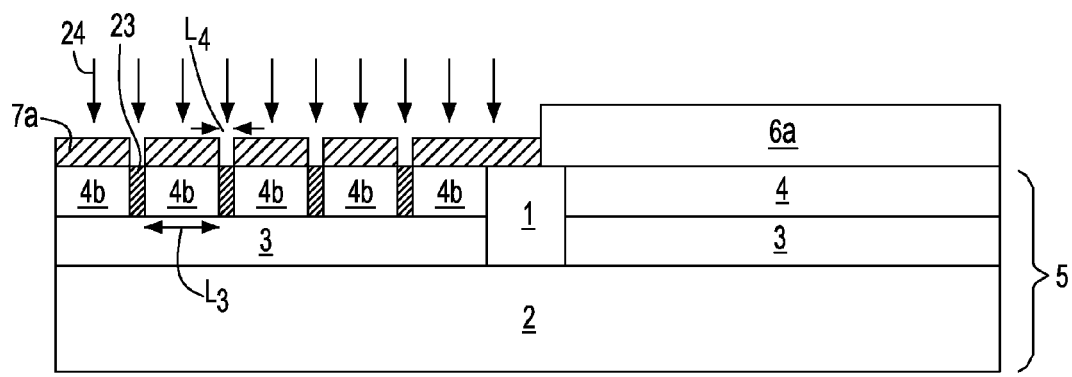
FIG. 8 is a side cross-sectional view depicting another embodiment of the present disclosure that includes implanting a first portion of the first strained layer of the first composition semiconductor material that is depicted in FIG. 2 to form relaxed islands of the first composition semiconductor material separated by amorphous implanted regions of the first composition semiconductor material, in accordance with the present disclosure.

FIG. 8 depicts one embodiment of implanting 24 a first portion of the first strained layer 4 that is depicted in FIG. 2 to form relaxed islands 4b of the first composition semiconductor material separated by amorphous implanted regions 23. The relaxed islands 4b of the first composition material are positioned in a first device region 10 of the SSDOI substrate 5. A remaining portion of the first strained layer 4 of the first composition semiconductor material is present in a second device region 15 of the SSDOI substrate 5.

In one embodiment, implanting 24 the first portion of the first strained layer of the first composition semiconductor material that is present in the first device region 10 of the SSDOI substrate 5 to form the relaxed islands 4b includes forming a first block mask 6a over a second portion of first strained layer 4 that is present in the second device region 15 of the SSDOI substrate 5. The first block mask 6a that is depicted in FIG. 8 is similar to the block mask 6 that is depicted in FIG. 2. Therefore, the description of the block mask 6 that is depicted in FIG. 2 is suitable for the first block mask 6a that is depicted in FIG. 8.

Referring to FIG. 8, a second block mask 7a may then be formed over the first portion of the first strained layer that is present in the first device region 10, wherein the second block mask 7a includes openings over regions of the first composition semiconductor material that are present separating the subsequently formed relaxed islands 4b of the first composition semiconductor material. The second block mask 7a that is depicted in FIG. 8 is similar to the etch mask 7 that is depicted in FIG. 3. Therefore, the description of the etch mask 7 that is depicted in FIG. 3 is suitable for the second block mask 7a that is depicted in FIG. 8.

Following formation of the second block mask 7a, dopants may be implanted into the regions of the first strained layer of the first composition semiconductor material that are exposed by the openings in the second block mask 7a. The dopants convert the implanted portions of the first composition semiconductor material into an amorphous material, which are hereafter referred to as amorphous implanted regions 23. An "amorphous material" is a non-crystalline solid that lacks the long-range order characteristic of a crystal. By implanting the first strained layer that is present in the first device region 10 to convert the first strained layer from a crystalline material to amorphous material, i.e., amorphous implanted regions 23, the intrinsic strain within the implanted portion of the first stained layer is relaxed to provide relaxed islands 4b of the first composition material. For example, in one embodiment, prior to being implanted with the dopant to convert the implanted regions to an amorphous material, i.e., amorphous implanted regions 23, the crystalline first strained layer of silicon (Si) may have an intrinsic tensile strain ranging from 200 MPa to 6 Gpa. After being implanted to form amorphous regions, i.e., amorphous implanted regions 23, separating the relaxed islands 4a of the first composition semiconductor material, the relaxed islands 4a of the first composition semiconductor material have a reduced intrinsic strain that may range from 10 MPa to 600 MPa. In another example, prior to being implanted with the dopant to convert the implanted regions to an amorphous material, i.e., amorphous implanted regions 23, the crystalline first strained layer of silicon (Si) may have an intrinsic tensile strain ranging from 600 MPa to 1.6 GPa. After being implanted to form amorphous regions separating the relaxed islands 4a of the first composition semiconductor material, the relaxed islands 4a of the first composition semiconductor material have a reduced intrinsic strain that may range from 10 MPa to 160 MPa.

In one embodiment, the length L3 for each of the relaxed islands 4b of the first composition semiconductor material ranges from 20 nm to 200 nm. In another embodiment, the length L3 for each of the relaxed islands 4b of the first composition semiconductor material ranges from 50 nm to 150 nm. In yet another embodiment, the length L3 for each of the relaxed islands 4b of the first composition semiconductor material ranges from 100 nm to 150 nm. In one embodiment, the length L4 for the amorphous implanted regions 23 between the adjacent relaxed islands 4b of the first composition semiconductor material may range from 1 nm to 25 nm. In another embodiment, the length L4 for the amorphous implanted regions 23 between the adjacent relaxed islands 4b of the first composition semiconductor material may range from 5 nm to 20 nm. In yet another embodiment, the length L4 for the amorphous implanted regions 23 between the adjacent relaxed islands 4b of the first composition semiconductor material may range from 10 nm to 15 nm. The above dimensions for the length L3 of the relaxed islands 4b of the first composition semiconductor material, and the length L4 for the amorphous implanted regions 23 between the adjacent relaxed islands 4b of the first composition semiconductor material are provided for illustrative purposes only and are not intended to limit the present disclosure.

The amorphous implanted regions 23 may be formed by ion implantation of at least one ion from Group IV of the Periodic Table of Elements into the SOI substrate 10. Examples of Group IV ions that can be used in creating the amorphous implanted regions 23 include, for example, Si, Ge, C or any combinations thereof. Typical conditions for the ion implantation that are used in creating the amorphous implanted regions 23 include an ion dose from 5E14 atoms/cm$^3$ to 5E15 atoms/cm$^3$ and an energy from 5 keV to 50 keV. Other ion implantation conditions can also be used provided that the other conditions create an amorphous implanted regions 23 as described above. Other dopants to the first strained layer into the amorphous implanted regions 23 may be selected from the group consisting of argon (Ar), helium (He), fluorine (F) or a combination thereof. The first strained layer 4 that is present in the second device region 15 is typically protected by the first block mask 6a during the process steps for forming the amorphous implanted regions 23 in the first device region 10.

Figure 9:
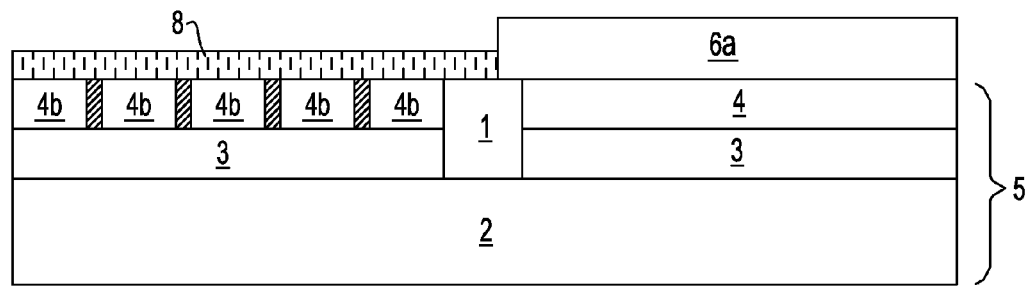
FIG. 9 is a side cross-sectional view depicting forming a second composition semiconductor material over the relaxed islands of the first composition semiconductor material that is depicted in FIG. 8, in accordance with one embodiment of the present disclosure.

FIG. 9 depicts forming a second composition semiconductor material 8 over the relaxed islands 4b of the first composition semiconductor material and over the amorphous implanted regions 23. In one embodiment, forming the second composition semiconductor material 8 over the relaxed islands 4b of the first composition semiconductor material comprises epitaxially deposition of the second composition semiconductor material 8. The second composition semiconductor material 8 typically includes germanium. For example, the second composition semiconductor material 8 may be silicon germanium (SiGe). The second composition semiconductor material 8 that is depicted in FIG. 9 is similar to the second composition semiconductor material 8 that is described above with reference to FIG. 4. Therefore, the description of the second composition semiconductor material 8 that is depicted in FIG. 4 is suitable for the second composition semiconductor material 8 that is depicted in FIG. 9.

In a following process step, the second composition semiconductor material 8 is intermixed with the relaxed islands 4b of the first composition semiconductor material to provide a second strained layer in the first device region 10 having a different strain than the first strained layer in the second device region 15. The intermixing of the second composition semiconductor material with the relaxed islands of the first composition semiconductor material may include thermal annealing. The details of the processing for intermixing the second composition semiconductor material 8 is intermixed with the relaxed islands 4b of the first composition semiconductor material are described above with reference to FIG. 5. In one embodiment, an oxide layer may be formed atop a condensed second strained layer of silicon germanium. Details for the formation of the oxide layer and the condensed second strained layer are described above with reference to FIG. 6. The formation of the oxide layer and the condensation of the second strained layer are optional. When present the oxide layer is typically removed before forming semiconductor devices on the second strained layer. In one embodiment, the first strained layer 4 in the second device region 15 of the SSDOI substrate 5 is tensile strained silicon (Si), and the second strained layer that is present in the first device region 10 is compressive strained silicon germanium (SiGe).

In some embodiments, an n-type semiconductor device, such as an n-type planar field effect transistor (n-type FET) or n-type fin field effect transistor (n-type finFET) is formed on the first strained layer 4 in the second device region 15, and a p-type semiconductor device, such as a p-type planar field effect transistor (FET) or p-type fin field effect transistor (p-type finFET) is formed on the second strained layer in the second device region 15. Further details for forming semiconductor devices on the first strained layer 4 that is present in the second device region 15 and the second strained layer that is present in the first device region 10 are described above with reference to FIGS. 7A and 7B.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor device comprising:
    providing a first strained layer of a first composition semiconductor material over a dielectric layer;
    etching a first portion of the first strained layer of the first composition semiconductor material to form relaxed islands of the first composition semiconductor material, wherein a second portion of the first strained layer maintains an intrinsic strain;
    forming a second composition semiconductor material over the relaxed island of the first composition semiconductor material; and
    intermixing the second composition semiconductor material with the relaxed islands of the first composition semiconductor material to provide a second strained layer of a third composition semiconductor material having a different strain than the intrinsic strain of the first strained layer.

2. The method of claim 1, wherein the first composition semiconductor material is silicon (Si), and the intrinsic strain of the first strained layer is a tensile strain.

3. The method of claim 1, wherein the first strained layer of the first composition semiconductor material is silicon and is in direct contact with the dielectric layer.

4. The method of claim 1, wherein the etching of the first portion of the first strained layer of the first composition semiconductor material to form the relaxed islands comprises:

forming a first etch mask over the second portion of the first strained layer of the first composition semiconductor material;

forming a second etch mask over the first portion of the first strained layer of the first composition semiconductor material, wherein the second mask includes openings over regions of the first composition semiconductor material that are present separating subsequently formed said relaxed islands of the first composition semiconductor material; and applying an etch process, wherein the etch process removes the regions of the first composition semiconductor material exposed by the openings in the second mask.

5. The method of claim 1, wherein the forming the second composition semiconductor material over the relaxed island of the first composition semiconductor material comprises epitaxially deposition of the second composition semiconductor material, wherein the second composition semiconductor material includes germanium (Ge).

6. The method of claim 1, wherein the second composition semiconductor material that is deposited over the relaxed island of the first composition semiconductor material comprises greater than 20 wt % germanium.

7. The method of claim 1, wherein the intermixing of the second composition semiconductor material with the relaxed islands of the first composition semiconductor material comprises thermal annealing.

8. The method of claim 7, wherein the thermal annealing comprises a temperature ranging from 800° C. to 1200° C.

9. The method of claim 1, wherein the first strained layer in the second portion of the layer of the first composition semiconductor material is tensile strained silicon (Si), and the second strained layer of the third composition semiconductor material is compressive strained silicon germanium (SiGe).

10. The method of claim 9 further comprising forming an n-type semiconductor device on the first strained layer that maintains the intrinsic strain, and forming a p-type semiconductor device on the second strained layer of the third composition semiconductor material.

11. The method of claim 9, wherein an upper half of the third composition semiconductor material has a germanium (Ge) concentration ranging from 10 wt. % to 90 wt. % and a lower half of the third composition semiconductor material has a germanium (Ge) concentration ranging from 10 wt. % to 90 wt. %.

12. The method of claim 1 further comprising oxidizing an upper surface of the second strained layer of the third composition semiconductor material to form an oxide, and removing the oxide.

13. The method of claim 12, wherein after removing the oxide, a remaining portion of the second strained layer of the third composition semiconductor material has a germanium concentration ranging from 10 wt. % to 99 wt. %.

14. A method of forming a semiconductor device comprising:

providing a first strained layer of a first composition semiconductor material over a dielectric layer;

implanting a first portion of the first strained layer of the first composition semiconductor material to form relaxed islands of the first composition semiconductor material separated by amorphous implanted regions of the first composition semiconductor material, wherein a second portion of the first strained layer maintains an intrinsic strain;

forming a second composition semiconductor material over the relaxed island of the first composition semiconductor material; and intermixing the second composition semiconductor material with the relaxed islands of the first composition semiconductor material to provide a second strained layer having a different strain than the intrinsic strain of the first strained layer.

15. The method of claim 14, wherein the implanting of the first portion of the first strained layer of the first composition semiconductor material to form the relaxed islands comprises:

forming a first block mask over the second portion of the first strained layer of the first composition semiconductor material;

forming a second block mask over the first portion of the first strained layer of the first composition semiconductor material, wherein the second bock mask includes openings over regions of the first composition semiconductor material that are present separating subsequently formed said relaxed islands of the first composition semiconductor material; and implanting dopants into the regions of the layer of the first composition semiconductor material that are exposed by said openings in said second block mask, wherein the dopants convert the first composition semiconductor material into an amorphous material.

16. The method of claim 15, wherein the dopants to convert the first composition semiconductor material into the amorphous material are selected from the group consisting of silicon (Si), germanium (Ge), argon (Ar), helium (He), fluorine (F) or a combination thereof.

17. The method of claim 15, wherein the forming the second composition semiconductor material over the relaxed island of the first composition semiconductor material comprises epitaxially deposition of the second composition semiconductor material, wherein the second composition semiconductor material includes germanium.

18. The method of claim 15, wherein the intermixing of the second composition semiconductor material with the relaxed islands of the first composition semiconductor material comprises thermal annealing.

19. The method of claim 15, wherein the first strained layer in the second portion of the layer of the first composition semiconductor material is tensile strained silicon (Si), and the second strained layer of the third composition semiconductor material is compressive strained silicon germanium (SiGe).

20. The method of claim 15, further comprising oxidizing an upper surface of the second strained layer of the third composition semiconductor material to form an oxide, and removing the oxide.

* * * * *